United States Patent
Jeon et al.

(10) Patent No.: US 12,153,751 B2
(45) Date of Patent: Nov. 26, 2024

(54) ELECTRONIC DEVICE INCLUDING AN INPUT SENSOR AND AN OPTICAL SENSOR

(71) Applicant: SAMSUNG DISPLAY CO., LTD., Yongin-si (KR)

(72) Inventors: Hyunjee Jeon, Hanam-si (KR); Sanghyun Lim, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/146,365

(22) Filed: Dec. 24, 2022

(65) Prior Publication Data

US 2023/0280853 A1 Sep. 7, 2023

(30) Foreign Application Priority Data

Mar. 2, 2022 (KR) .......................... 10-2022-0026793

(51) Int. Cl.
*G06F 3/041* (2006.01)
*G01J 1/44* (2006.01)
*G06F 3/044* (2006.01)

(52) U.S. Cl.
CPC .............. *G06F 3/0412* (2013.01); *G01J 1/44* (2013.01); *G06F 3/0416* (2013.01); *G06F 3/0443* (2019.05); *G06F 3/0446* (2019.05); *G06F 2203/04111* (2013.01); *G06F 2203/04112* (2013.01)

(58) Field of Classification Search
CPC .... G06F 3/0412; G06F 3/0416; G06F 3/0443; G06F 3/0446; G06F 2203/04111; G06F 2203/04112

See application file for complete search history.

(56) References Cited

U.S. PATENT DOCUMENTS

| | | | |
|---|---|---|---|
| 11,093,084 B2 | 8/2021 | Tang et al. | |
| 11,271,054 B2 | 3/2022 | Lee et al. | |
| 2015/0130751 A1* | 5/2015 | Teraguchi | G06F 3/0412 345/80 |
| 2015/0227252 A1* | 8/2015 | Ivanov | G06F 3/04166 345/174 |
| 2021/0181870 A1* | 6/2021 | Tang | G06F 3/0421 |
| 2021/0320137 A1* | 10/2021 | Kim | G06V 40/1318 |
| 2022/0164066 A1* | 5/2022 | Chu | H10K 59/40 |

FOREIGN PATENT DOCUMENTS

| | | |
|---|---|---|
| JP | 6930712 | 9/2021 |
| KR | 10-0639005 | 10/2006 |
| KR | 10-2020-0042981 | 4/2020 |

* cited by examiner

*Primary Examiner* — Liliana Cerullo
(74) *Attorney, Agent, or Firm* — F. Chau & Associates, LLC

(57) ABSTRACT

An electronic device includes a display panel, an input sensor that is disposed on the display panel and that includes a first sensing electrode and a second sensing electrode that crosses the first sensing electrode, and an optical sensor disposed on the input sensor. The optical sensor includes a photo-electrode disposed on one of the first sensing electrode and the second sensing electrode and a light receiving element that electrically connects one of the first sensing electrode to the second sensing electrode and the photo-electrode.

18 Claims, 15 Drawing Sheets

ELECTRONIC DEVICE INCLUDING AN INPUT SENSOR AND AN OPTICAL SENSOR

CROSS-REFERENCE TO RELATED APPLICATIONS

This application claims priority under 35 U.S.C. § 119 to Korean Patent Application No. 10-2022-0026793, filed on Mar. 2, 2022, in the Korean Intellectual Property Office, the disclosure of which is incorporated by reference herein in its entirety.

TECHNICAL FIELD

The present disclosure relates to an electronic device, and more particularly, to an electronic device including an input sensor and an optical sensor.

DISCUSSION OF THE RELATED ART

Electronic devices, such as televisions, mobile phones, laptop/notebook computers, tablet computers, vehicle navigation systems, portable game consoles and the like may incorporate the use of display panels so as to display images to a user. The electronic devices may further include various input devices such as a keyboard and/or a mouse/trackpad. Recent electronic devices include a touch panel for sensing a touch of a user and/or a touch of an active or passive pen/stylus as an input device.

SUMMARY

An electronic device includes a display panel. An input sensor is disposed on the display panel and includes a first sensing electrode and a second sensing electrode that crosses the first sensing electrode. An optical sensor is disposed on the input sensor. The optical sensor includes a photo-electrode disposed on either the first sensing electrode or the second sensing electrode and a light receiving element that electrically connects either the first sensing electrode or the second sensing electrode to the photo-electrode.

One of the first sensing electrode and the second sensing electrode may be a transmitting electrode, and the other may be a receiving electrode. The photo-electrode may be electrically connected to the transmitting electrode.

The light receiving element may include a photo-conductive element.

The photo-conductive element may include cadmium sulfide.

The photo-electrode may be disposed on a same layer as the first sensing electrode and the second sensing electrode.

The first sensing electrode, the second sensing electrode, and the photo-electrode may have a mesh shape.

The electronic device may further include an encapsulation layer disposed on the display panel, and the input sensor may be disposed directly on the encapsulation layer.

The input sensor may further include an insulating layer disposed on the display panel and a conductive layer disposed on the insulating layer. The first sensing electrode, the second sensing electrode, and the photo-electrode may be disposed in the conductive layer.

The light receiving element may be disposed on the insulating layer and may cover the photo-electrode as well as either the first sensing electrode or the second sensing electrode.

The electronic device may further include a sensing driver that drives the input sensor and the optical sensor, and the photo-electrode may be connected to the sensing driver.

The optical sensor may further include a photo-resistive element connected between the photo-electrode and the sensing driver, and the sensing driver may sense external light, based on a photo-voltage distributed between a first resistance of the light receiving element and a second resistance of the photo-resistive element.

An emissive area in which a pixel of the display panel is disposed and a non-emissive area adjacent to the emissive area may be defined. The first sensing electrode, the second sensing electrode, the photo-electrode, and the light receiving element may each be disposed in the non-emissive area.

The first sensing electrode may extend in a first direction and may include a plurality of first sensor parts and a plurality of first connecting parts that connect the first sensor parts. The second sensing electrode may extend in a second direction crossing the first direction and may include a plurality of second sensor parts and a plurality of second connecting parts that connect the second sensor parts.

The first sensor parts, the second sensor parts, and the second connecting parts may be disposed in a same layer. The first connecting pans may be disposed on a different layer from each of the first sensor parts, the second sensor parts, and the second connecting parts.

At least one of the plurality of second sensor parts may include a first portion and a second portion spaced apart from each other. The photo-electrode may be disposed between the first portion and the second portion.

The light receiving element may be provided in plural. Some of the plurality of light receiving elements may connect the first portion to the photo-electrode, and the other light receiving elements may connect the second portion to the photo-electrode.

The optical sensor may further include a light blocking pattern disposed between the photo-electrode and the light receiving element in a thickness direction of the photo-electrode. The light blocking pattern may at least partially overlap the light receiving element.

A plurality of sensor units may be defined in the input sensor. The optical sensor may be disposed in at least some of the plurality of sensor units.

Each of the first sensing, the second sensing electrode, and the photo-electrode may be provided in plural. Each of the photo-electrodes may be disposed between first sensing electrodes adjacent to each other among the plurality of first sensing electrodes or between second sensing electrodes adjacent to each other among the plurality of second sensing electrodes. The light receiving element may include a first light receiving element connected to one of the second sensing electrodes adjacent to each other and a second light receiving element connected to the other one of the second sensing electrodes adjacent to each other.

The sensing driver may include a multiplexer, and the sensing driver may operate the input sensor and the optical sensor in a time-division manner through the multiplexer.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
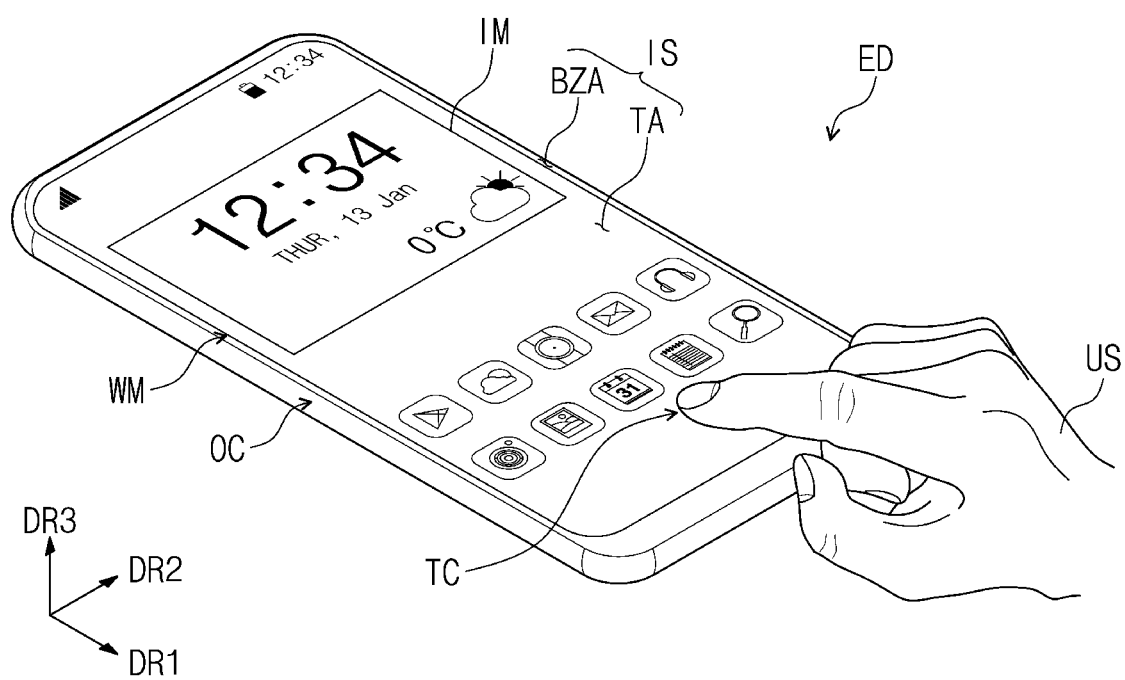
FIG. 1 is a perspective view of an electronic device according to an embodiment of the present disclosure.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween.

Identical reference numerals may refer to identical components throughout the specification and the figures. Additionally, in the drawings, while the relative thicknesses, proportions, dimensions, and angles of components represent at least one embodiment of the present disclosure, drawn to scale, it is to be understood that changes may be made to these properties within the spirit and scope of the present invention. As used herein, the term "and/or" includes all of one or more combinations defined by related components.

Terms such as first, second, and the like may be used to describe various components, but the components should not necessarily be limited by the terms. The terms may be used for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Hereinafter, embodiments of the present disclosure will be described with reference to the accompanying drawings.

Figure 2:
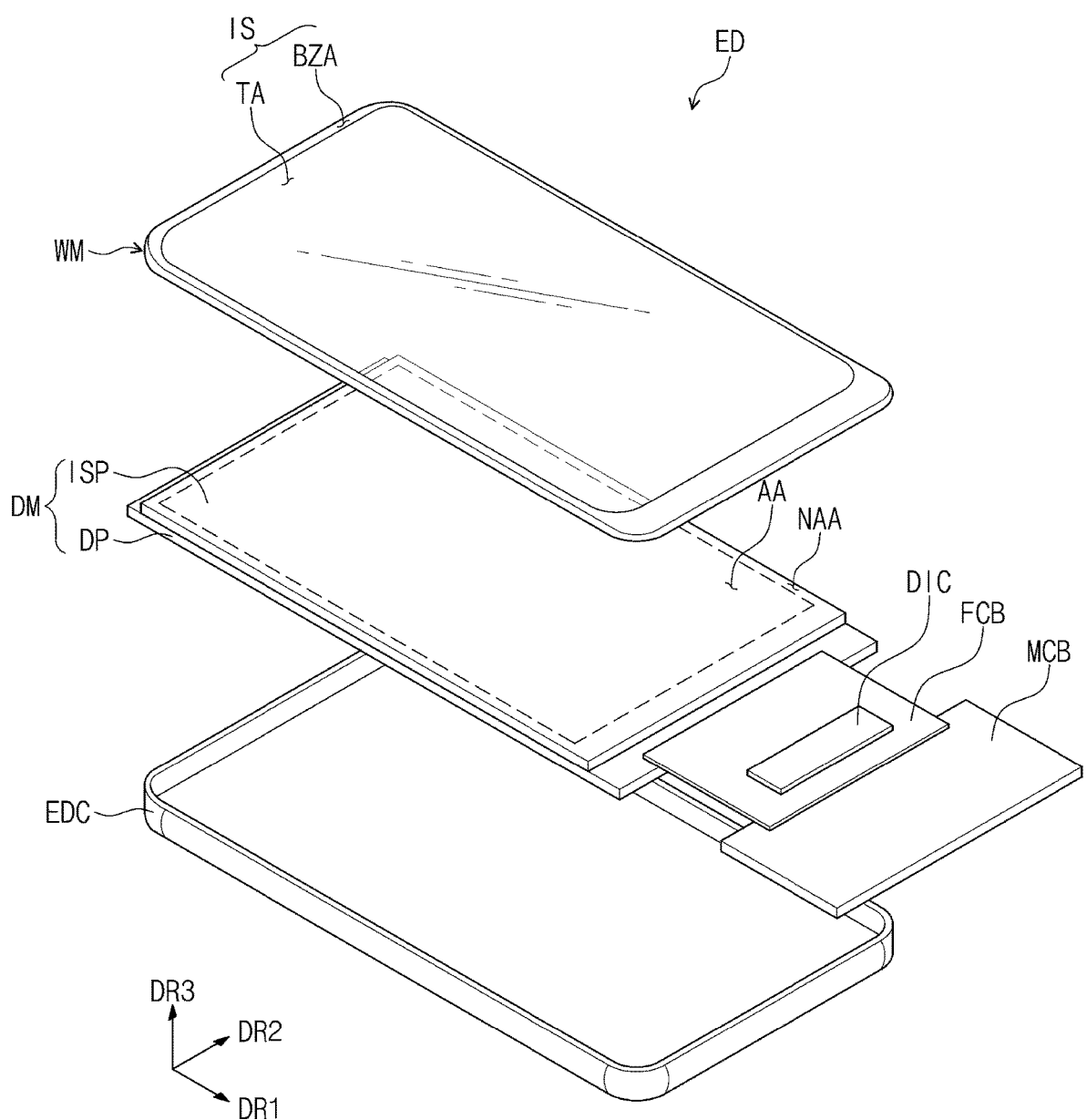
FIG. 2 is an exploded perspective view of the electronic device illustrated in FIG. 1.

FIG. 1 is a perspective view of an electronic device according to an embodiment of the present disclosure. FIG. 2 is an exploded perspective view of the electronic device illustrated in FIG. 1.

Referring to FIGS. 1 and 2, the electronic device ED may be a device that is activated in response to an electrical signal. The electronic device ED, according to the present disclosure, may be a large display device such as a television, a computer monitor, or the like, or may be a small or medium-sized display device such as a mobile phone, a tablet computer, a vehicle navigation unit, a portable game machine, or the like. However, these devices are merely illustrative, and the electronic device ED may be employed for various other electronic devices.

The electronic device ED may have a substantially rectangular shape with a pair of long sides extending in a first direction DR1 and a pair of short sides extending in a second direction DR2 crossing the first direction DR1. However, without necessarily being limited thereto, the electronic device ED may have various shapes. The electronic device ED may display an image IM in a third direction DR3 on a display surface IS that is parallel to each of the first direction DR1 and the second direction DR2. The display surface IS, on which the image IM is displayed, may correspond to the front surface of the electronic device ED.

In this embodiment, front surfaces (or, upper surfaces) and rear surfaces (or, lower surfaces) of elements are defined based on the direction in which the image IM is displayed. The front surfaces and the rear surfaces may be opposite each other in the third direction DR3, and the normal directions of the front surfaces and the rear surfaces may be parallel to the third direction DR3.

The separation distance between the front surface and the rear surface of the electronic device ED in the third direction DR3 may correspond to the thickness of the electronic device ED in the third direction DR3. The directions indicated by the first, second, and third directions DR1, DR2, and DR3 may be relative concepts and may be changed to different directions.

The electronic device ED may sense an external input. The external input may include various forms of input provided from outside of the electronic device ED. The electronic device ED, according to an embodiment of the present disclosure, may sense an external input TC of a user US. The external input TC of the user US may be one of various forms of external inputs, such as a touch by a part of the user's body, light, heat, pressure, and the like, or may be a combination thereof. In this embodiment, it is exemplified that the external input TC of the user US is a touch input applied to the front surface of the electronic device ED by a hand/finger of the user US. However, this is illustrative, and the external input TC of the user US may be provided in various forms as described above. Furthermore, the electronic device ED may sense the external input TC of the user US that is applied to the side surface or the rear surface of the electronic device ED depending on the structure of the electronic device ED, but is not necessarily limited to any one embodiment.

The electronic device ED, according to an embodiment of the present disclosure, may sense a second external input.

The second input may include inputs by an input device (e.g., a stylus pen, an active pen, a touch pen, an electronic pen, an e-pen, or the like) other than the hand/finger of the user US.

The front surface of the electronic device ED may be divided into a transmissive area TA and a bezel area BZA. The transmissive area TA may be an area where the image IM is displayed. The user US visually recognizes the image IM through the transmissive area TA. In this embodiment, the transmissive area TA is illustrated as having a rounded rectangular shape (e.g., a rectangle with rounded corners). However, this is illustrative, and the transmissive area TA may have various shapes and is not necessarily limited to any one embodiment.

The bezel area BZA is adjacent to the transmissive area TA. The bezel area BZA may have a predetermined color. The bezel area BZA may at least partially surround the transmissive area TA. Accordingly, the shape of the transmissive area TA may be substantially defined by the bezel area BZA. However, this is illustrative, and the bezel area BZA may be disposed adjacent to only one side of the transmissive area TA, or may be omitted entirely. The electronic device ED, according to an embodiment of the present disclosure, may include various embodiments and is not necessarily limited to any one embodiment.

As illustrated in FIG. 2, the electronic device ED may include a display module DM and a window WM disposed on the display module DM. The display module DM may include a display panel DP and an input sensor ISP.

The display panel DP, according to an embodiment of the present disclosure, may be an emissive display panel. For example, the display panel DP may be an organic light emitting display panel, an inorganic light emitting display panel, or a quantum-dot light emitting display panel. An emissive layer of the organic light emitting display panel may contain an organic light emitting material. An emissive layer of the inorganic light emitting display panel may contain an inorganic light emitting material. An emissive layer of the quantum-dot light emitting display panel may contain quantum dots, quantum rods, and the like. Hereinafter, in this embodiment, it is exemplified that the display panel DP is an organic light emitting diode (OLED) display panel.

The display panel DP may output the image IM, and the output image IM may be displayed through the display surface IS. The input sensor ISP may be disposed on the display panel DP and may sense the external input TC and the second input. A configuration and operation of the input sensor ISP will be described below with reference to FIGS. 4 to 6.

The window WM may be formed of a transparent material (e.g., transparent to visible light) through which the image IM is able to be output. For example, the window WM may be formed of glass, sapphire, plastic, or the like. Although the window WM is illustrated as being only a single layer, the window WM is not necessarily limited thereto and may include a plurality of layers.

The above-described bezel area BZA of the electronic device ED may be formed by printing a material having a predetermined color on substantially one area of the window WM. In an embodiment of the present disclosure, the window WM may include a light blocking pattern for defining the bezel area BZA. The light blocking pattern may be a colored organic film and may be formed by, for example, coating.

The window WM may be coupled to the display module DM through an adhesive film. In an embodiment of the present disclosure, the adhesive film may include an optically clear adhesive (OCA) film. However, without necessarily being limited thereto, the adhesive film may include a conventional adhesive or sticky material. For example, the adhesive film may include an optically clear resin (OCR) or a pressure sensitive adhesive (PSA) film.

An anti-reflection layer may be additionally disposed between the window WM and the display module DM. The anti-reflection layer decreases the reflectivity of external light incident from above the window WM. The anti-reflection layer, according to an embodiment of the present disclosure, may include a phase retarder and a polarizer. The phase retarder may be of a film type or a liquid-crystal coating type and may include $\lambda/2$ phase retarder (i.e., a half-wave plate) and/or a $\lambda/4$ phase retarder (i.e., a quarter-wave plate). The polarizer may also be of a film type or a liquid-crystal coating type. The film type may include a stretchable synthetic resin film, and the liquid-crystal coating type may include liquid crystals arranged in a predetermined arrangement. The phase retarder and the polarizer may be together implemented with a single polarizer film.

The display module DM may display an image in response to an electrical signal and may transmit/receive information about an external input. The display module DM may have an active area AA and a non-active area NAA defined therein. The active area AA may be defined as an area that outputs an image provided by the display module DM. Furthermore, the active area AA may be defined as an area where the input sensor ISP senses the external input TC and the second input that are externally applied.

The non-active area NAA may be adjacent to the active area AA. For example, the non-active area NAA may at least partially surround the active area AA. However, this is illustrative, and the non-active area NAA may be defined in various shapes and is not necessarily limited to any one embodiment. According to an embodiment, the active area AA of the display module DM may correspond to at least a portion of the transmissive area TA.

The display module DM may further include a main circuit board MCB, a flexible circuit film FCB, and a driver IC DIC. The main circuit board MCB may be connected to the flexible circuit film FCB and may accordingly be electrically connected to the display panel DP. The flexible circuit film FCB may be connected to the display panel DP and may electrically connect the display panel DP and the main circuit board MCB.

The main circuit board MCB may include a plurality of drive elements. The plurality of drive elements may include a circuit unit for driving the display panel DP. The driver IC DIC may be mounted on the flexible circuit film FCB. Although one flexible circuit film FCB is illustrated, the present disclosure is not necessarily limited thereto, and a plurality of flexible circuit films FCB may be connected to the display panel DP. FIG. 2 illustrates the structure in which the driver IC DIC is mounted on the flexible circuit film FCB. However, the present disclosure is not necessarily limited thereto. For example, the driver IC DIC may be directly mounted on the display panel DP. In this case, the portion of the display panel DP on which the driver IC DIC is mounted may be bent and may be disposed on the rear surface of the display module DM. Alternatively, the driver IC DIC may be directly mounted on the main circuit board MCB.

The input sensor ISP may be electrically connected to the main circuit board MCB through the flexible circuit film FCB. However, the present disclosure is not necessarily limited thereto. For example, the display module DM may additionally include a separate flexible circuit film for electrically connecting the input sensor ISP with the main circuit board MCB.

The electronic device ED further includes an outer case EDC that accommodates the display module DM. The outer case EDC may be coupled to the window WM and may define the exterior of the electronic device ED. The outer case EDC protects components accommodated in the outer case EDC, by absorbing external shock and preventing infiltration of foreign matter/moisture into the display module DM. In an embodiment of the present disclosure, the outer case EDC may be provided in a form in which a plurality of storage members are combined.

The electronic device ED, according to an embodiment, may further include an electronic module including various functional modules for operating the display module DM, a power supply module that supplies power required for overall operation of the electronic device ED, and a bracket that is coupled to the display module DM and/or the outer case EDC and that divides the inner space of the electronic device ED.

Figure 3:
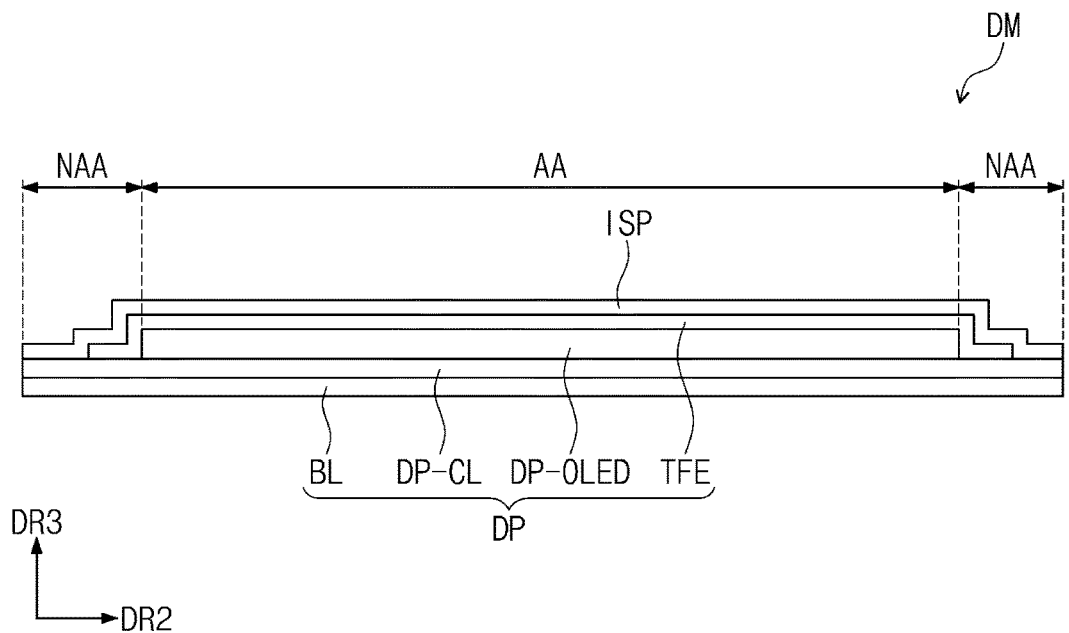
FIG. 3 is a cross-sectional view of a display module illustrated in FIG. 2.

FIG. 3 is a cross-sectional view of the display module illustrated in FIG. 2.

Referring to FIG. 3, the display module DM includes the display panel DP and the input sensor ISP. The display panel DP includes a base layer BL, and a circuit element layer DP-CL, a display element layer DP-OLED, and an encapsulation layer TFE that are disposed on the base layer BL. The display panel DP may further include functional layers such as an anti-reflection layer, a reflective index control layer, and the like.

The base layer BL may include at least one plastic film. The base layer BL may include a plastic substrate, a glass substrate, a metal substrate, or an organic/inorganic composite substrate. In an embodiment of the present disclosure, the base layer BL may be a flexible substrate. The active area AA and the non-active area NAA, that have been described above with reference to FIG. 2, may be similarly or identically defined in the base layer BL.

The circuit element layer DP-CL includes at least one intermediate insulating layer and at least one circuit element. The intermediate insulating layer includes at least one intermediate inorganic layer and at least one intermediate organic layer. The circuit element includes signal lines and a pixel drive circuit.

The display element layer DP-OLED includes a light emitting element. The light emitting element may include at least organic light emitting diodes. The display element layer DP-OLED may further include an organic film such as a pixel defining film.

The encapsulation layer TFE seals the display element layer DP-OLED. The encapsulation layer TFE includes at least one inorganic layer. The encapsulation layer TFE may further include at least one organic layer. The inorganic layer protects the display element layer DP-OLED from moisture/oxygen, and the organic layer protects the display element layer DP-OLED from foreign matter such as dust particles. The inorganic layer may include a silicon nitride layer, a silicon oxy-nitride layer, a silicon oxide layer, a titanium oxide layer, or an aluminum oxide layer. The organic layer may include, but is not necessarily limited to, an acrylate-based organic layer.

The input sensor ISP may be formed on the display panel DP through a single continuous process. Alternatively, the input sensor ISP and the display panel DP may be coupled to each other through an adhesive film. The input sensor ISP may have a multi-layer structure. The input sensor ISP may include a single insulating layer or a plurality of insulating layers. According to an embodiment of the present disclosure, when the input sensor ISP is disposed directly on the display panel DP through the continuous process, the input sensor ISP is disposed directly on the encapsulation layer TFE, and an adhesive film is not disposed between the input sensor ISP and the display panel DP. However, in an embodiment, an adhesive film may be disposed between the input sensor ISP and the display panel DP. In this case, the input sensor ISP might not be manufactured together with the display panel DP through the continuous process and may be manufactured separately from the display panel DP and then fixed to the upper surface of the display panel DP by the adhesive film.

However, in an embodiment of the present disclosure, the display panel DP may further include an encapsulation substrate. The encapsulation substrate may be disposed on the display element layer DP-OLED and may face the base layer BL. The encapsulation substrate may include a plastic substrate, a glass substrate, a metal substrate, or an organic/inorganic composite substrate. A sealant may be disposed between the encapsulation substrate and the base layer BL, and the encapsulation substrate and the base layer BL may be coupled to each other by the sealant. The sealant may include a frit that is an organic adhesive or a ceramic adhesive. The display element layer DP-OLED may be sealed by the sealant and the encapsulation substrate.

When the input sensor ISP is disposed directly on the display panel DP through the continuous process, the input sensor ISP may be disposed directly on the encapsulation substrate. However, when the adhesive film is disposed between the input sensor ISP and the display panel DP, the input sensor ISP may be fixed to the upper surface of the encapsulation substrate by the adhesive film.

Figure 4:
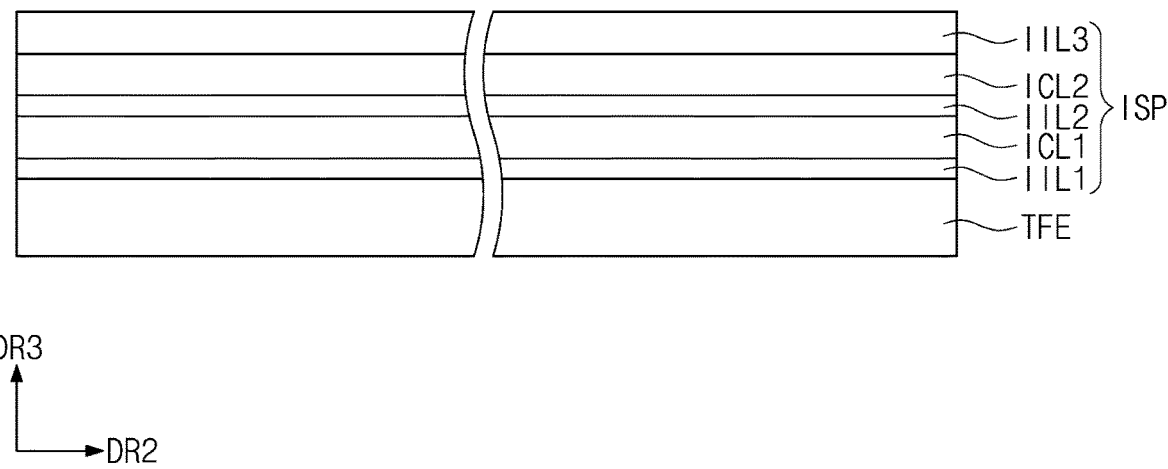
FIG. 4 is a cross-sectional view of an input sensor according to an embodiment of the present disclosure.

FIG. 4 is a cross-sectional view of the input sensor according to an embodiment of the present disclosure.

Referring to FIG. 4, the input sensor ISP, according to an embodiment of the present disclosure, may include a first sensing insulation layer IUL1, a first conductive layer ICL1, a second sensing insulation layer IIL2, a second conductive layer ICL2, and a third sensing insulation layer IIL3. The first sensing insulation layer IIL1 may be disposed directly on the encapsulation layer TFE. However, in an embodiment of the present disclosure, the first sensing insulation layer IIL1 may be omitted.

Each of the first conductive layer ICL1 and the second conductive layer ICL2 includes a plurality of conductive patterns. The conductive patterns may include a plurality of sensing electrodes SE1_1 to SE1_5 and SE2_1 to SE2_4 (refer to FIG. 6) and a plurality of signal lines SL1_1 to SL1_5 and SL2_1 to SL2_4 connected thereto (refer to FIG. 6).

Each of the first sensing insulation layer IIL1, the second sensing insulation layer IIL2, and the third sensing insulation layer IIL3 may contain an inorganic material or an organic material. In this embodiment, the first sensing insulation layer IIL1 and the second sensing insulation layer IIL2 may be inorganic layers. The inorganic layers may contain at least one of aluminum oxide, titanium oxide, silicon oxide, silicon oxy-nitride, zirconium oxide, and hafnium oxide. The inorganic layers may have a thickness of 1000 Å to 4000 Å.

The third sensing insulation layer IIL3 may be an organic layer. The organic layer may contain an acrylate-based resin, a methacrylate-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin. The third sensing insulation layer IIL3 containing an organic material may prevent infiltration of moisture into the first conductive layer ICL1 and the second conductive layer ICL2 from the outside.

Figure 5:
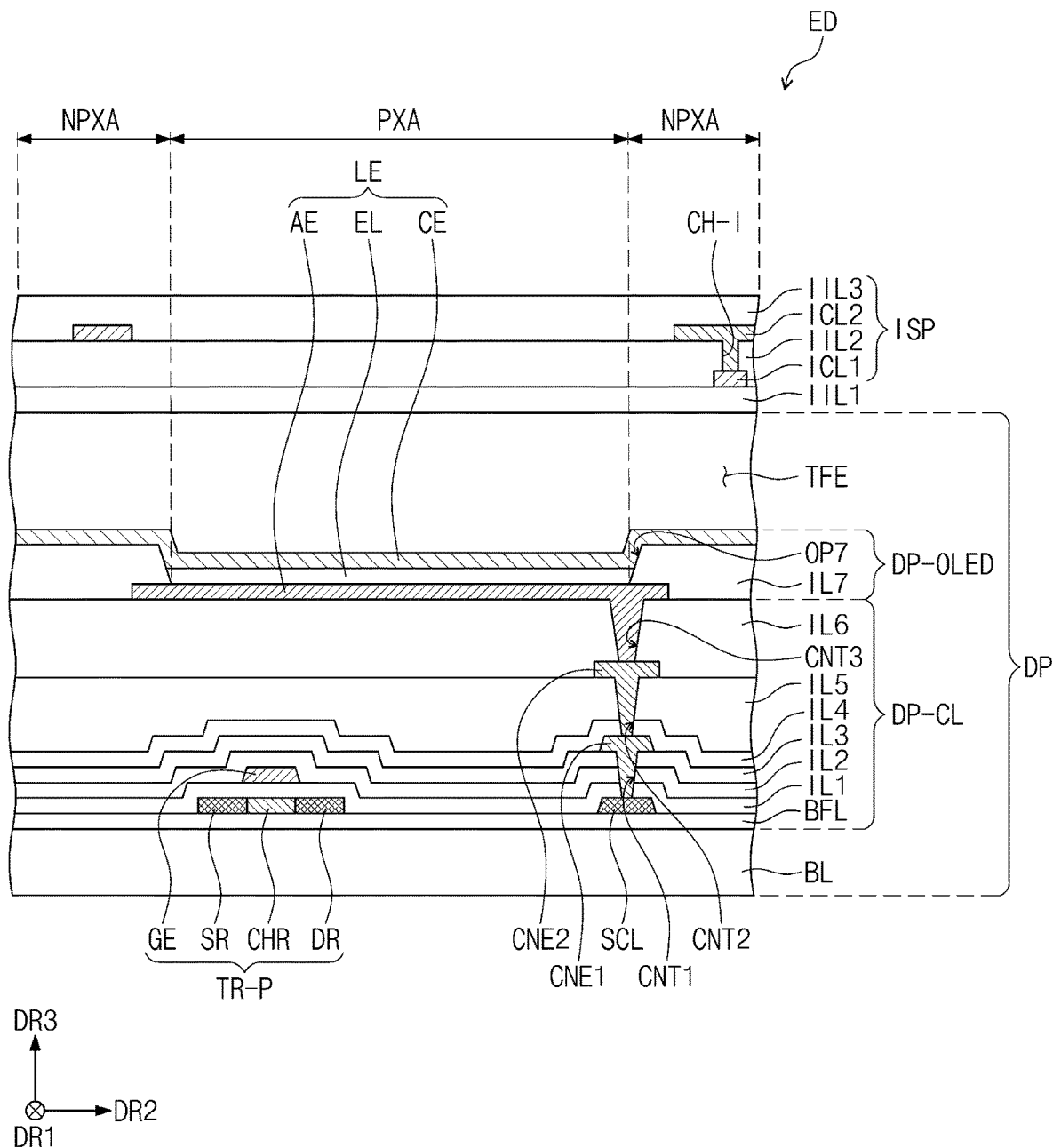
FIG. 5 is a cross-sectional view of the electronic device according to an embodiment of the present disclosure.

FIG. 5 is a cross-sectional view of the electronic device according to an embodiment of the present disclosure.

Referring to FIG. 5, the electronic device ED may include the display panel DP and the input sensor ISP disposed directly on the display panel DP. The display panel DP may include the base layer BL, the circuit element layer DP-CL, the display element layer DP-OLED, and the upper insulating layer TFE. The upper insulating layer TFE may be an encapsulation layer.

The display panel DP and the input sensor ISP may each include the active area AA and the non-active area NAA. FIG. 5 is an enlarged view of a portion of the active area AA.

The base layer BL may provide a base surface on which the circuit element layer DP-CL is disposed. The circuit element layer DP-CL may be disposed on the base layer BL. The circuit element layer DP-CL may include an insulating layer, a semiconductor pattern, a conductive pattern, and a signal line. The insulating layer, a semiconductor layer, and a conductive layer may be formed on the base layer BL by a process such as coating or deposition and may be selectively subjected to patterning by performing a photolithography process a plurality of times. Thereafter, the semiconductor pattern, the conductive pattern, and the signal line included in the circuit element layer DP-CL may be formed.

At least one inorganic layer is formed on the upper surface of the base layer BL. In this embodiment, the display panel DP is illustrated as including a buffer layer BFL. The buffer layer BFL may increase a coupling force between the base layer BL and the semiconductor pattern. The buffer layer BFL may include silicon oxide layers and silicon nitride layers, and the silicon oxide layers and the silicon nitride layers may be alternately stacked, one above another.

The semiconductor pattern may be disposed on the buffer layer BFL. The semiconductor pattern may contain polysilicon. However, without necessarily being limited thereto, the semiconductor pattern may contain amorphous silicon or metal oxide.

FIG. 5 illustrates a part of semiconductor patterns, and semiconductor patterns may be additionally disposed in other areas. The semiconductor patterns may be arranged across pixels according to a specific rule. The semiconductor pattern may have different electrical properties depending on whether the semiconductor pattern is doped or not. The semiconductor pattern may include a first area having a relatively high conductivity and a second area having a relatively low conductivity. The first area may be doped with an N-type dopant or a P-type dopant. A P-type transistor includes a doped area doped with a P-type dopant. The second area may be an undoped area, or may be an area more lightly doped than the first area.

The first area may have a higher conductivity than the second area and may substantially serve as an electrode or a signal line. The second area may substantially correspond to an active area (or, a channel area) of a pixel transistor TR-P. For example, one portion of the semiconductor pattern may be an active area of a transistor, and another portion may be a source area or a drain area of the transistor.

Each of the pixels may have an equivalent circuit including seven transistors, one capacitor, and a light emitting element, and the equivalent circuit of the pixel may be modified in various forms. FIG. 5 illustrates one pixel transistor TR-P and a light emitting element LE that are included in the pixel.

A source area SR, a channel area CHR, and a drain area DR of the pixel transistor TR-P may be formed from the semiconductor pattern. The source area SR and the drain area DR may extend from the channel area CHR in opposite directions on the section. FIG. 5 illustrates a portion of a signal transmitting area SCL formed to be the first area of the semiconductor pattern. The signal transmitting area SCL may be electrically connected to the pixel transistor TR-P in a plan view.

A first insulating layer IL1 may be disposed on the buffer layer BFL. The first insulating layer IL1 may commonly overlap a plurality of pixels and may cover the semiconductor pattern. The first insulating layer IL1 may be an inorganic layer and/or an organic layer and may have a single-layer structure or a multi-layer structure. The first insulating layer IL1 may contain aluminum oxide, titanium oxide, silicon oxide, silicon nitride, silicon oxy-nitride, zirconium oxide, and/or hafnium oxide. In this embodiment, the first insulating layer IL1 may be a single silicon oxide layer. Not only the first insulating layer IL1 but also insulating layers of the circuit element layer DP-CL, which will be described below, may be inorganic layers and/or organic layers and may have a single-layer structure or a multi-layer structure. The inorganic layers may contain at least one of the aforementioned materials, but are not necessarily limited thereto.

A gate GE of the pixel transistor TR-P is disposed on the first insulating layer IL1. The gate GE may be a portion of a metal pattern. The gate GE overlaps the channel area CHR. The gate GE may function as a mask in a process of doping the semiconductor pattern.

A second insulating layer IL2 may be disposed on the first insulating layer IL1 and may cover the gate GE. The second insulating layer IL2 may commonly overlap the pixels. The second insulating layer IL2 may be an inorganic layer and/or an organic layer and may have a single-layer structure or a multi-layer structure. In this embodiment, the second insulating layer IL2 may be a single silicon oxide layer.

A third insulating layer IL3 may be disposed on the second insulating layer IL2. In this embodiment, the third insulating layer IL3 may be a single silicon oxide layer. A first connecting electrode CNE1 may be disposed on the third insulating layer IL3. The first connecting electrode CNE1 may be connected to the signal transmitting area SCL through a contact hole CNT1 that penetrates the first insulating layer IL1, the second insulating layer IL2, and the third insulating layer IL3.

A fourth insulating layer IL4 may be disposed on the third insulating layer IL3. The fourth insulating layer IL4 may be a single silicon oxide layer. A fifth insulating layer IL5 may be disposed on the fourth insulating layer IL4. The fifth insulating layer IL5 may be an organic layer.

A second connecting electrode CNE2 may be disposed on the fifth insulating layer IL5. The second connecting electrode CNE2 may be connected to the first connecting electrode CNE1 through a contact hole CNT2 that penetrates the fourth insulating layer IL4 and the fifth insulating layer IL5.

A sixth insulating layer IL6 may be disposed on the fifth insulating layer IL5 and may cover the second connecting electrode CNE2. The sixth insulating layer IL6 may be an organic layer. The display element layer DP-OLED may be disposed on the circuit element layer DP-CL. The display element layer DP-OLED may include the light emitting element LE. The light emitting element LE may include a first electrode AE, an emissive layer EL, and a second electrode CE. For example, the emissive layer EL may include an organic light emitting material, quantum dots, quantum rods, a micro-LED, or a nano-LED.

The first electrode AE may be disposed on the sixth insulating layer IL6. The first electrode AE may be connected to the second connecting electrode CNE2 through a contact hole CNT3 penetrating the sixth insulating layer IL6.

A pixel defining film IL7 may be disposed on the sixth insulating layer IL6 and may cover a portion of the first electrode AE. The pixel defining film IL7 has an opening OP7 defined therein. The opening OP7 of the pixel defining film IL7 exposes at least a portion of the first electrodes AE. In this embodiment, an emissive area PXA is defined to correspond to a partial area of the first electrode AE exposed through the opening OP7. A non-emissive area NPXA may at least partially surround the emissive area PXA.

The emissive layer EL may be disposed on the first electrode AE. The emissive layer EL may correspond to the opening OP7. For example, the emissive layer EL may be separately formed for each of the pixels. When the emissive layer EL is separately formed for each of the pixels, the emissive layers EL may each emit blue light, red light, and/or green light. However, without necessarily being limited thereto, the emissive layer EL may be connected to the pixels and may be commonly provided. In this case, the emissive layer EL may provide blue light or white light.

The second electrode CE may be disposed on the emissive layer EL. The second electrode CE may have an integral shape (e.g., formed of a single uninterrupted structure) and may be commonly disposed for the plurality of pixels. A common voltage may be provided to the second electrode CE, and the second electrode CE may be referred to as the common electrode.

A hole control layer may be disposed between the first electrode AE and the emissive layer EL. The hole control layer may be commonly disposed in the emissive area PXA and the non-emissive area NPXA. The hole control layer may include a hole transporting layer and may further include a hole injection layer. An electron control layer may be disposed between the emissive layer EL and the second electrode CE. The electron control layer may include an electron transporting layer and may further include an electron injection layer. The hole control layer and the electron control layer may be commonly formed for the plurality of pixels, for example, by using an open mask.

The input sensor ISP may be directly formed on the upper surface of the upper insulating layer TFE through a continuous process. The input sensor ISP may include the first sensor insulating layer IIL1, the first conductive layer ICL1, the second sensor insulating layer IIL2, the second conductive layer ICL2, and the third sensor insulating layer IIL3. The first sensor insulating layer IIL1 may be omitted.

Each of the first conductive layer ICL1 and the second conductive layer ICL2 may have a single-layer structure, or may include a plurality of patterns having a multi-layer structure stacked in the third direction DR3. The conductive layer having the single-layer structure may include a metal layer or a transparent conductive layer. The metal layer may contain molybdenum, silver, titanium, copper, aluminum, or an alloy thereof. The transparent conductive layer may contain transparent conductive oxide such as indium tin oxide (ITO), indium zinc oxide (IZO), zinc oxide (ZnO), or indium zinc tin oxide (IZTO). In addition, the transparent conductive layer may contain a conductive polymer such as PEDOT, a metal nano wire, or graphene.

The conductive layer having the multi-layer structure may include metal layers. The meal layers may have, for example, a three-layer structure of titanium/aluminum/titanium. The conductive layer having the multi-layer structure may include at least one metal layer and at least one transparent conductive layer.

The second sensor insulating layer IIL2 covers the first conductive layer ICL1, and the third sensor insulating layer IIL3 covers the second conductive layer ICL2. Although each of the first to third sensor insulating layers IIL1, IIL2, and IIL3 is illustrated as a single layer, the present disclosure is not necessarily limited thereto.

The first sensor insulating layer IIL1 and/or the second sensor insulating layer IIL2 may include an inorganic film. The inorganic film may contain aluminum oxide, titanium oxide, silicon oxide, silicon nitride, silicon oxy-nitride, zirconium oxide, and/or hafnium oxide.

The third sensor insulating layer IIL3 may include an organic film. The organic film may contain an acrylate-based resin, a methacrylate-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

Figure 6:
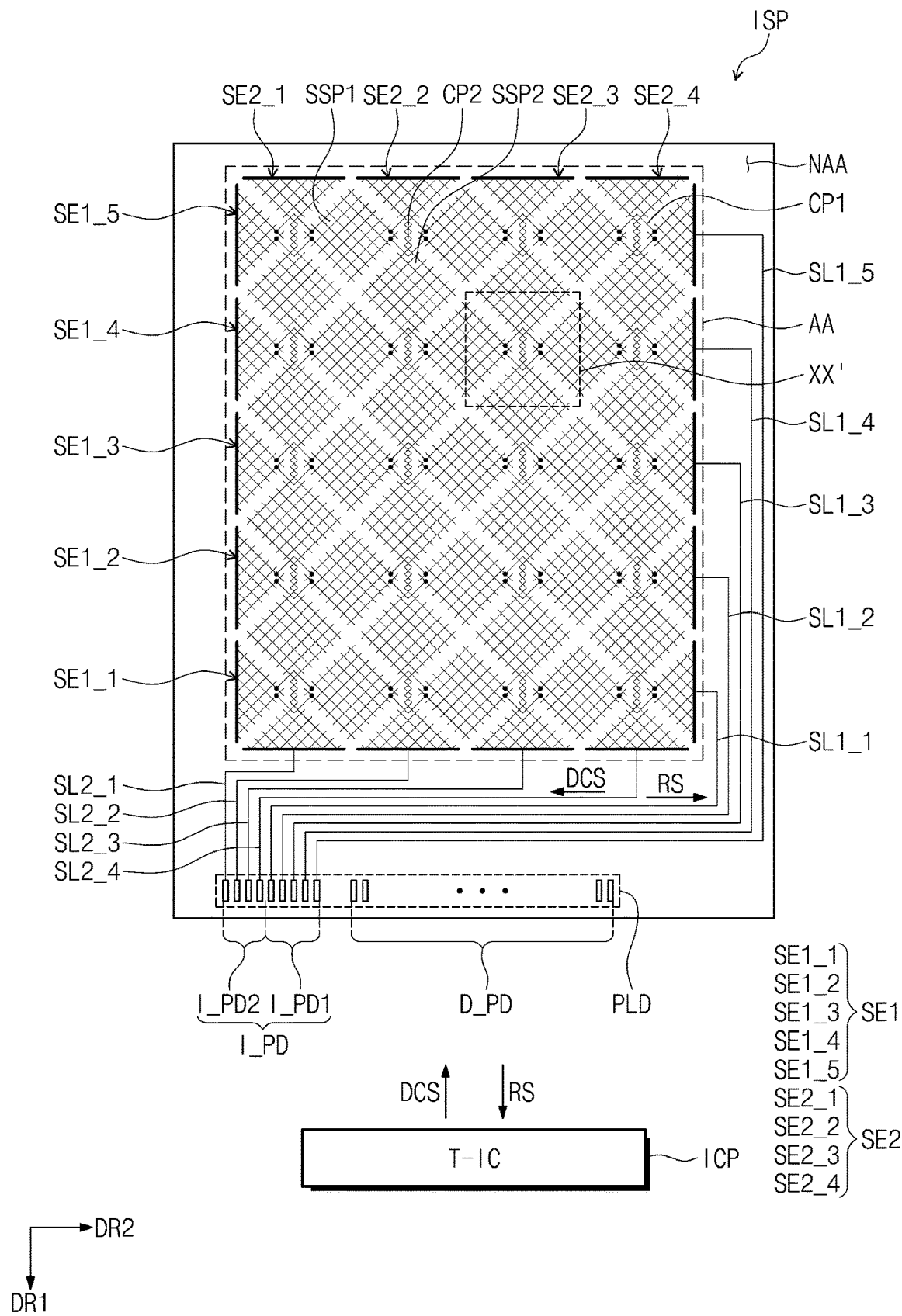
FIG. 6 is a plan view of the input sensor according to an embodiment of the present disclosure.

FIG. 6 is a plan view of the input sensor according to an embodiment of the present disclosure.

Referring to FIG. 6, the input sensor ISP, according to an embodiment of the present disclosure, includes the active area AA and the non-active area NAA adjacent to the active area AA. The plurality of sensing electrodes SE1_1 to SE1_5 and SE2_1 to SE2_4 may be disposed in the active area AA, and the plurality of signal lines SL1_1 to SL1_5 and SL2_1 to SL2_4 may be disposed in the non-active area NAA.

In an embodiment of the present disclosure, the input sensor ISP may include a first sensing electrode SE1 and a second sensing electrode SE2. One of the first sensing electrode SE1 and the second sensing electrode SE2 may be a receiving electrode, and the other may be a transmitting electrode. For example, the first sensing electrode SE1 may be a receiving electrode, and the second sensing electrode SE2 may be a transmitting electrode. The receiving electrode SE1 may include the plurality of receiving electrodes SE1_1 to SE1_5, and the transmitting electrode SE2 may include the plurality of transmitting electrodes SE2_1 to SE2_4. Hereinafter, in this specification, it will be exemplified that the first sensing electrode SE1 is a receiving electrode and the second sensing electrode SE2 is a transmitting electrode.

The signal lines SL1_1 to SL1_5 and SL2_1 to SL2_4 may include the receiving signal lines SL1_1 to SL1_5 connected to the receiving electrodes SE1_1 to SE1_5 and the transmitting signal lines SL2_1 to SL2_4 connected to the transmitting electrodes SE2_1 to SE2_4. The receiving signal lines SL1_1 to SL1_5 may be referred to as the first signal lines. The transmitting signal lines SL2_1 to SL2_4 may be referred to as the second signal lines.

The receiving electrodes SE1_1 to SE1_5 and the transmitting electrodes SE2_1 to SE2_4 cross each other. The receiving electrodes SE1_1 to SE1_5 are arranged in the first direction DR1 and extend in the second direction DR2. The transmitting electrodes SE2_1 to SE2_4 are arranged in the second direction DR2 and extend in the first direction DR1.

The input sensor ISP may obtain coordinate information using a mutual-capacitance method (e.g., a mutual-cap method). Capacitances are formed between the receiving electrodes SE1_1 to SE1_5 and the transmitting electrodes SE2_1 to SE2_4. The capacitances between the receiving electrodes SE1_1 to SE1_5 and the transmitting electrodes SE2.1 to SE2_4 may be changed by the external input TC (refer to FIG. 1) applied by the body of the user US (refer to FIG. 1). In an embodiment of the present disclosure, the capacitances between the receiving electrodes SE1_1 to SE1_5 and the transmitting electrodes SE2_1 to SE2_4 may be changed by an external input applied by an input device other than the body of the user US. The sensing sensitivity of the input sensor ISP may be determined depending on the amounts of change in the capacitances.

However, the present disclosure is not necessarily limited thereto, and the input sensor ISP may obtain coordinate information using a self-capacitance method (e.g., a self-cap method). The receiving electrodes SE1_1 to SE1_5 and the transmitting electrodes SE2_1 to SE2_4 may be integrated into one sensing electrode and may sense the external input TC.

In an embodiment, in obtaining coordinate information, the input sensor ISP is not necessarily limited to one of the mutual-capacitance method and the self-capacitance method. The input sensor ISP may obtain coordinate information using both the mutual-capacitance method and the self-capacitance method.

Each of the receiving electrodes SE1_1 to SE1_5 includes first sensor parts SSP1 and first connecting parts CP1 disposed in the active area AA. Each of the transmitting electrodes SE2_1 to SE2_4 includes second sensor parts SSP2 and second connecting parts CP2 disposed in the active area AA.

Two first sensor parts disposed at opposite ends of one receiving electrode among the first sensor parts SSP1 may have a smaller size than a first sensor part disposed at the center of the one receiving electrode. For example, the two first sensor parts may be half the size of the first sensor part disposed at the center of the one receiving electrode. Two second sensor parts disposed at opposite ends of one transmitting electrode among the second sensor parts SSP2 may have a smaller size than a second sensor part disposed at the center of the one transmitting electrode. For example, the two second sensor parts may be half the size of the second sensor part disposed at the center of the one transmitting electrode.

Although the receiving electrodes SE1_1 to SE1_5 and the transmitting electrodes SE2_1 to SE2_4, according to an embodiment, are illustrated in FIG. 6, the shapes thereof are not necessarily limited thereto. In an embodiment of the present disclosure, the receiving electrodes SE1_1 to SE1_5 and the transmitting electrodes SE2_1 to SE2_4 may have a shape (e.g., a bar shape) without distinction between the sensor parts and the connecting parts. In FIG. 6, the first sensor parts SSP1 and the second sensor parts SSP2 are illustrated as having a rhombic shape. However, without necessarily being limited thereto, the first sensor parts SSP1 and the second sensor parts SSP2 may have different polygonal shapes.

First sensor parts SSP1 in one receiving electrode are arranged in the second direction DR2, and second sensor parts SSP2 in one transmitting electrode are arranged in the first direction DR1. Each of the first connecting parts CP1 connects first sensor parts SSP1 adjacent to each other, and each of the second connecting parts CP2 connects second sensor parts SSP2 adjacent to each other.

The receiving electrodes SE1_1 to SE1_5 and the transmitting electrodes SE2_1 to SE2_4 may each have a mesh shape. As each of the receiving electrodes SE1_1 to SE1_5 and the transmitting electrodes SE2_1 to SE2_4 has a mesh shape, parasitic capacitance with electrodes included in the display panel DP (refer to FIG. 2) may be decreased.

The receiving electrodes SE1_1 to SE1_5 and the transmitting electrodes SE2_1 to SE2_4, which have a mesh shape, may contain silver, aluminum, copper, chromium, nickel, titanium, or the like, but are not necessarily limited thereto.

The receiving signal lines SL1_1 to SL1_5 and the transmitting signal lines SL2_1 and SL2_4 may be disposed in the non-active area NAA.

The input sensor ISP may include input pads I_PD that extend from ends of the receiving signal lines SL1_1 to SL1_5 and ends of the transmitting signal lines SL2_1 to SL2_4 and that are disposed in the non-active area NAA. The input pads I_PD may be electrically connected to the receiving signal lines SL1_1 to SL1_5 and the transmitting signal lines SL2_1 to SL2_4. In an embodiment of the present disclosure, the input pads I_PD may include receiving input pads I_PD1 to which the receiving signal lines SL1_1 to SL1_5 are electrically connected and transmitting input pads I_PD2 to which the transmitting signal lines SL2_1 to SL2_4 are electrically connected.

In an embodiment of the present disclosure, a pad area PLD in which the input pads I_PD are disposed may be included in the non-active area NAA. Some of the circuit elements disposed in the circuit element layer DP-CL (refer to FIG. 5) may be exposed from the intermediate insulating layer in the circuit element layer DP-CL to provide the input pads I_PD.

The pad area PLD may further include pixel pads D_PD for connecting the flexible circuit film FCB (refer to FIG. 2) to the display panel DP (refer to FIG. 2).

The electronic device ED may further include a sensing driver ICP that controls driving of the input sensor ISP.

In an embodiment of the present disclosure, the sensing driver ICP may be electrically connected to the input sensor ISP. The sensing driver ICP may be electrically connected to the receiving signal lines SL1_1 to SL1_5 and the transmitting signal lines SL2_1 to SL2_4 through the input pads I_PD.

The sensing driver ICP transmits a drive control signal DCS to the transmitting electrodes SE2_1 to SE2_4 and receives, from the receiving electrodes SE1_1 to SE1_5, sensing signals RS in which the amounts of change in the capacitances between the receiving electrodes SE1_1 to SE1_5 and the transmitting electrodes SE2_1 to SE2_4 are reflected. In an embodiment of the present disclosure, the drive control signal DCS may be a sensing scan signal sequentially transmitted to the transmitting electrodes SE2_1 to SE2_4. The sensing driver ICP may drive the input sensor ISP using a first method and/or a second method. The first method may be the mutual-capacitance method. The second method may be the self-capacitance method.

In an embodiment, one or more optical sensors may be disposed on the input sensor ISP. Each of the optical sensors includes a photo-electrode and a light receiving element. Hereinafter, the optical sensor will be described in detail.

Figure 7:
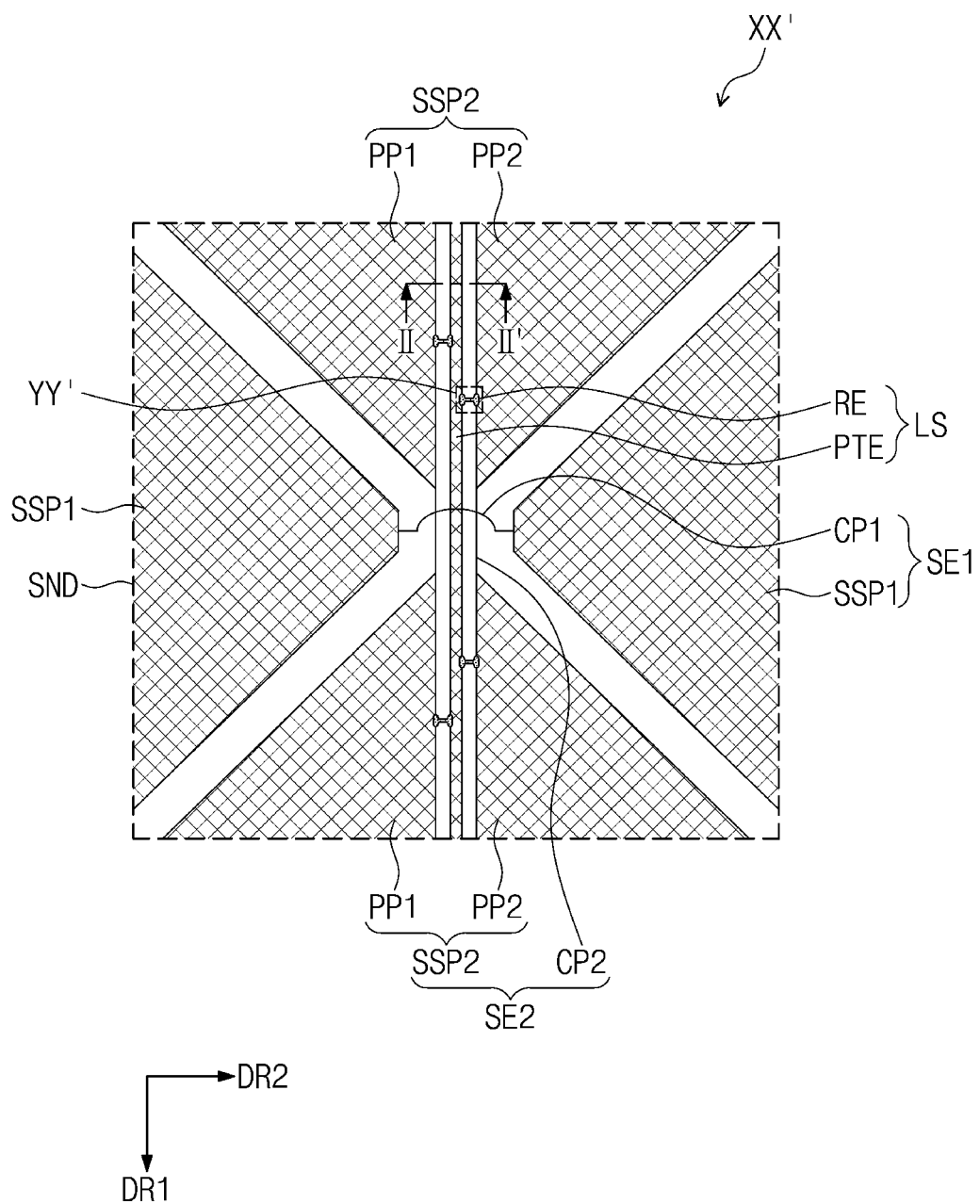
FIG. 7 is an enlarged view illustrating a sensor unit according to an embodiment of the present disclosure.
Figure 8:
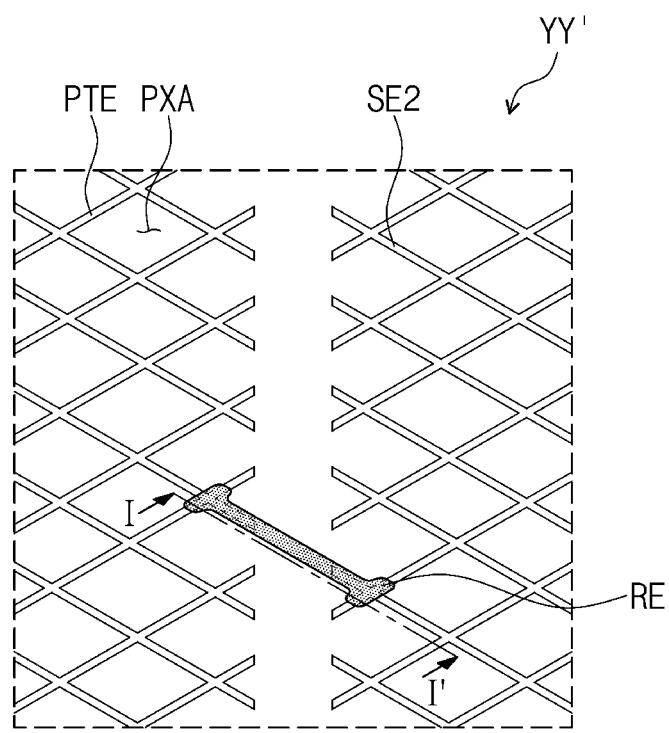
FIG. 8 is an enlarged view of an area YY' in FIG. 7.

FIG. 7 is an enlarged view illustrating a sensor unit according to an embodiment of the present disclosure. FIG. 7 is an enlarged view of an area XX' in FIG. 6. FIG. 8 is an enlarged view of an area YY' in FIG. 7.

The input sensor ISP (refer to FIG. 6) may include a plurality of sensor units SND. A first sensing electrode SE1, a second sensing electrode SE2, and a photo-electrode PTE may be disposed in each of the plurality of sensor units SND.

Referring to FIG. 7, the electronic device ED (refer to FIG. 1) may include an optical sensor LS. The optical sensor LS may include the photo-electrode PTE and a light receiving element RE. The optical sensor LS may sense external light. The optical sensor LS may be connected to the sensing driver ICP (refer to FIG. 5) and may sense external light.

The photo-electrode PTE may be disposed on the same layer as the first sensing electrode SE1 and the second sensing electrode SE2. In an embodiment, the photo-electrode PTE may be disposed adjacent to the second sensing electrode SE2 of the input sensor ISP (refer to FIG. 6). For example, the photo-electrode PTE may be disposed across the second sensing electrode SE2. The second sensing electrode SE2 may include a first portion PP1 and a second portion PP2. The first portion PP1 and the second portion PP2 may be connected to each other by a corresponding second signal line among the second signal lines SL21_1 to SL2_4.

The photo-electrode PTE may be disposed between the first portion PP1 and the second portion PP2. The photo-electrode PTE may be connected to the sensing driver ICP (refer to FIG. 6) by a separate signal line. Likewise to the second sensing electrode SE2, the photo-electrode PTE may extend in the first direction DR1. The photo-electrode PTE may have a mesh shape. The photo-electrode PTE is not directly connected to the first sensing electrode SE1 and the second sensing electrode SE2. The photo-electrode PTE may be electrically connected to the second sensing electrode SE2, which is a transmitting electrode, through the light receiving element RE.

The light receiving element RE may connect the second sensing electrode SE2 to the photo-electrode PTE. A plurality of light receiving elements RE may be provided in the active area AA (refer to FIG. 6). A plurality of light receiving elements RE may be provided in one sensor unit SND. Although four light receiving elements RE are illustrated in FIG. 7, the present disclosure is not necessarily limited thereto.

The light receiving element RE may connect the first portion PP1 to the photo-electrode PTE. The light receiving element RE may connect the second portion PP2 to the photo-electrode PTE. The light receiving element RE may connect the transmitting electrode SE2 to the photo-electrode PTE and may drive the optical sensor LS through the drive control signal DCS (refer to FIG. 6) of the transmitting electrode SE2. For example, the transmitting electrode SE2 may be used to drive the input sensor ISP (refer to FIG. 6) and the optical sensor LS.

The light receiving element RE may include a photo-conductive element. The photo-conductive element may contain, for example, cadmium sulfide (CdS). The cadmium sulfide has a property in which resistance changes in inverse proportion to the amount of received light. For example, as the amount of light received by the cadmium sulfide is increased, the magnitude of the resistance of the light receiving element RE may be decreased. As the magnitude of the resistance of the light receiving element RE is decreased, the magnitude of a photo-voltage Vphoto provided to the sensing driver ICP (refer to FIG. 6) may be increased. The sensing driver ICP may sense external light from the magnitude of the photo-voltage. Detailed description thereabout will be given with reference to FIG. 11.

In FIG. 7, the first sensing electrode SE1 may include first sensor parts SSP1 and a first connecting part CP1. The second sensing electrode SE2 may include second sensor parts SSP2 and a second connecting part CP2. The first connecting pan CP1 may cross the second connecting pan CP2. The second connecting part CP2 may extend on the same layer as the second sensor parts SSP2. The first connecting part CP1 may be disposed on a different layer from the first sensor parts SSP1 and may be connected to the first sensor parts SSP1 through contact holes. In FIG. 7, the first connecting part CP1 is illustrated as being disposed on a different layer from the first sensor parts SSP1. However, without necessarily being limited thereto, the second connecting part CP2 may be disposed on a different layer from the second sensor parts SSP2, and the first connecting part CP1 may extend on the same layer as the first sensor parts SSP1.

FIG. 8 illustrates the second sensing electrode SE2 and the photo-electrode PTE that have a mesh shape. The second sensing electrode SE2 and the photo-electrode PTE are spaced apart from each other without being directly connected to each other. The light receiving element RE may connect the photo-electrode PTE to the second sensing electrode SE2.

In FIG. 8, the second sensing electrode SE2 and the photo-electrode PTE have a mesh shape so as not to hide the emissive area PXA. So as not to hide the emissive area PXA, the light receiving element RE may be disposed in the non-emissive area NPXA (refer to FIG. 5) in which photo-electrode PTE and the second sensing electrode SE2 that have a mesh shape are disposed.

Figure 9:
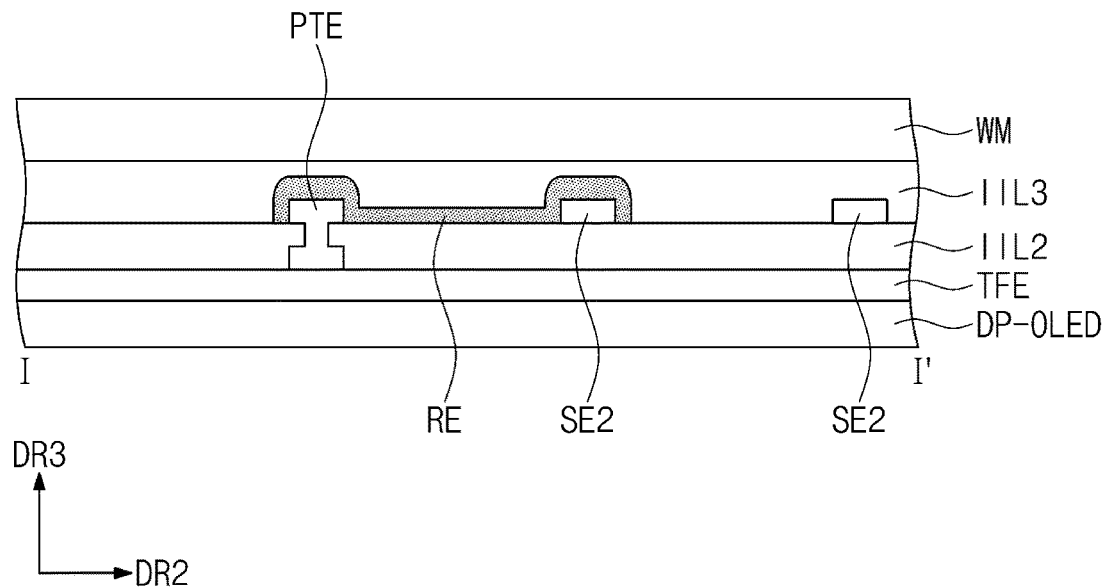
FIG. 9 is a cross-sectional view taken along line I-I' in FIG. 8.
Figure 10:
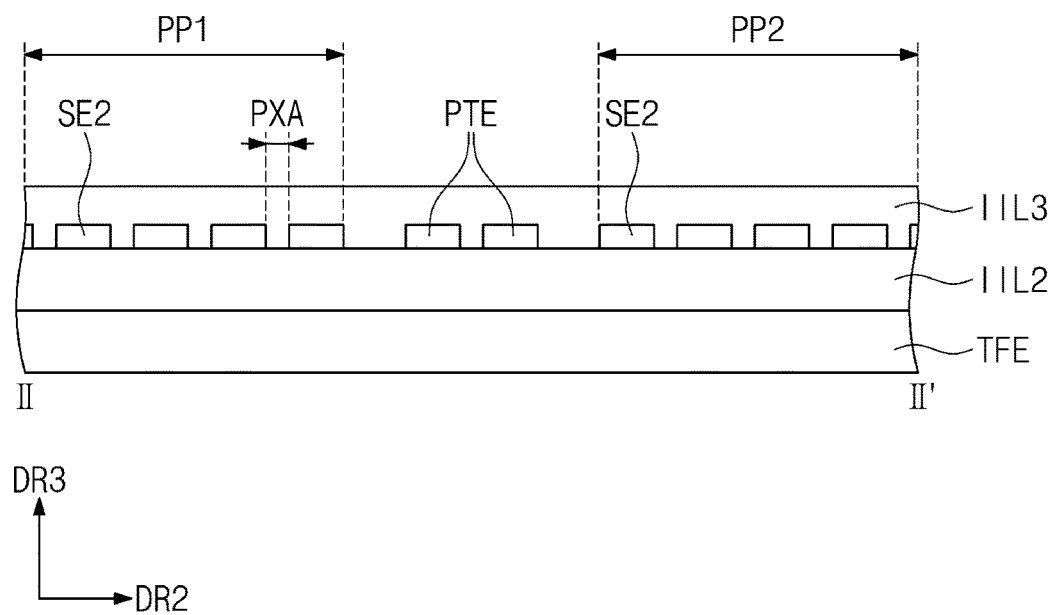
FIG. 10 is a cross-sectional view taken along line II-II' in FIG. 7.

FIG. 9 is a cross-sectional view taken along line I-I' in FIG. 8. FIG. 10 is a cross-sectional view taken along line II-II' in FIG. 7.

Referring to FIGS. 9 and 10, the light receiving element RE may cover the second sensing electrode SE2 and the photo-electrode PTE. The optical sensor LS including the light receiving element RE and the photo-electrode PTE may be disposed over the display element layer DP-OLED and thus might not be affected by a display element when sensing external light.

The second sensing electrode SE2 and the photo-electrode PTE may be disposed on the second insulating layer IIL2. For example, the second sensing electrode SE2 and the photo-electrode PTE may be disposed in the second conductive layer ICL2 (refer to FIG. 3). The photo-electrode PTE and/or the second sensing electrode SE2 may be disposed on the encapsulation layer TFE and the second insulating layer IIL2 and may be connected through a contact hole. In FIG. 9, the photo-electrode PTE is illustrated as being disposed on the encapsulation layer TFE and the second insulating layer IIL2. However, without necessarily being limited thereto, the photo-electrode PTE may be disposed on the second insulating layer IIL2, and the second sensing electrode SE2 may be disposed on the encapsulation layer TFE and the second insulating layer IIL2.

The light receiving element RE may be covered by the third insulating layer IIL3. For example, the third insulating layer IIL3 may cover the second sensing electrode SE2, the photo-electrode PTE, and the light receiving element RE.

The photo-electrode PTE and the second sensing electrode SE2 include mesh lines. An emissive area PXA may be defined between adjacent mesh lines. In the case of the photo-electrode PTE, two mesh lines are illustrated. However, the present disclosure is not necessarily limited thereto.

Figure 11:
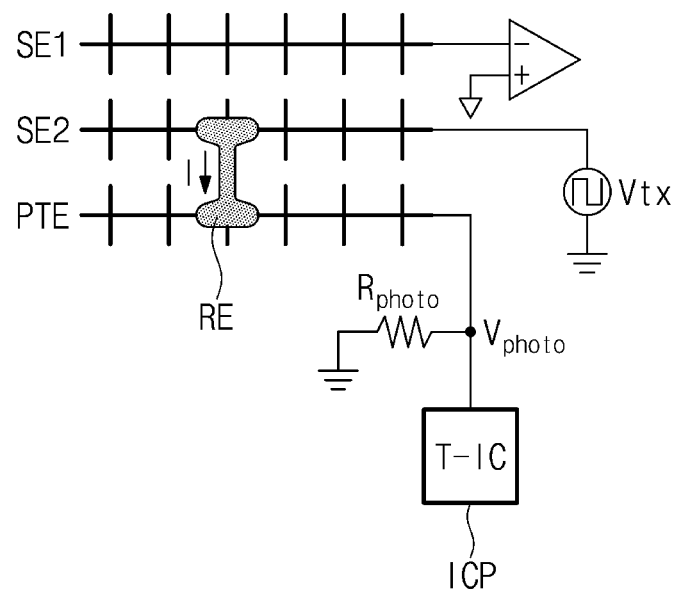
FIG. 11 is a schematic view illustrating an optical-sensor driving method according to an embodiment of the present disclosure.

FIG. 11 is a schematic view illustrating an optical-sensor driving method according to an embodiment of the present disclosure. FIG. 11 schematically illustrates mesh shapes of the first sensing electrode SE1, the second sensing electrode SE2, and the photo-electrode PTE.

The transmitting electrode SE2 may be driven by a drive voltage Vtx. Electric current I may flow from the transmitting electrode SE2 to the photo-electrode PTE through the light receiving element RE. The photo-electrode PTE may be connected to the sensing driver ICP.

In an embodiment, the optical sensor LS may include a photo-resistive element Rphoto between the sensing driver ICP and the photo-electrode PTE. The photo-voltage Vphoto may be applied between the photo-resistive element Rphoto and the light receiving element RE, and sensed external light may be input to the sensing driver ICP through the magnitude of the photo-voltage. The sensing driver ICP may determine the amount of sensed light, based on the magnitude of the input photo-voltage.

The sensing driver ICP may determine the amount of external light sensed through the optical sensor LS (refer to FIG. 7) and may transfer information about the determined amount of light to a main driver of the main circuit board MCB (refer to FIG. 2) to adjust the luminance of the display panel DP (refer to FIG. 2).

In an embodiment, the photo-resistive element Rphoto may be disposed in the sensing driver ICP. Alternatively, the photo-resistive element Rphoto may be disposed in the active area AA (refer to FIG. 6). The photo-resistive element Rphoto may be disposed on the main circuit board MCB (refer to FIG. 2) or the flexible circuit film FCB (refer to FIG. 2).

In an embodiment, the magnitude of the photo-voltage may be calculated by Equation 1 below. Here, Vphoto may be the magnitude of the photo-voltage provided to the sensing driver ICP, Rphoto may be the magnitude of the resistance of the photo-resistive element Rphoto, Reds may be the magnitude of the resistance of the light receiving element RE, and Vtx may be the drive voltage of the transmitting electrode SE2.

$$V_{photo} = \frac{R_{photo}}{R_{photo} + R_{Cds}} \times V_{tx}$$ [Equation 1]

For example, the optical sensor LS (refer to FIG. 7) and the sensing driver ICP may sense external light, based on the magnitude of the photo-voltage Vphoto distributed between the resistance of the light receiving element RE and the resistance of the photo-resistive element Rphoto that are changed depending on the amount of external light sensed.

Figure 12A:
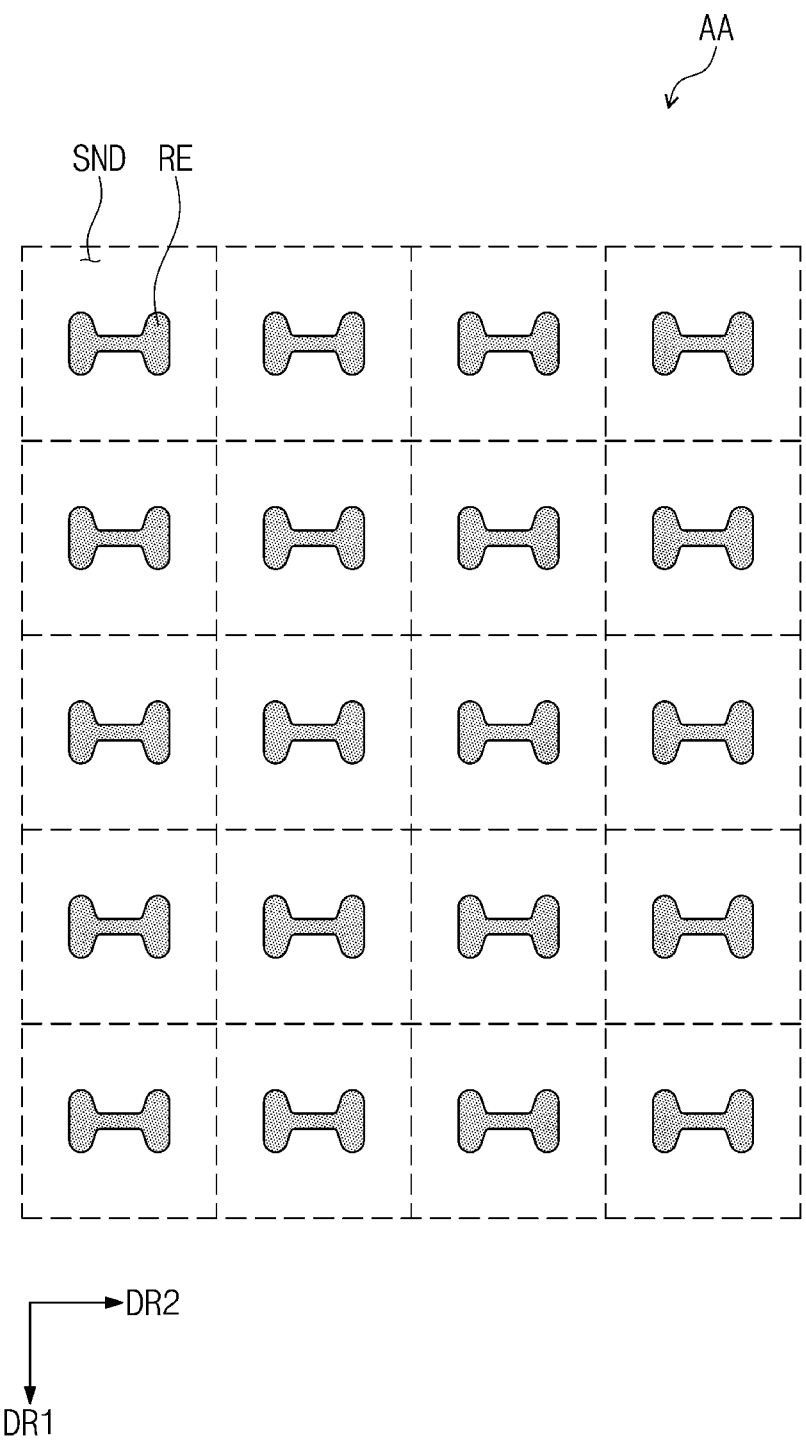
FIGS. 12A and 12B are schematic views illustrating an active area according to an embodiment of the present disclosure.
Figure 12B:
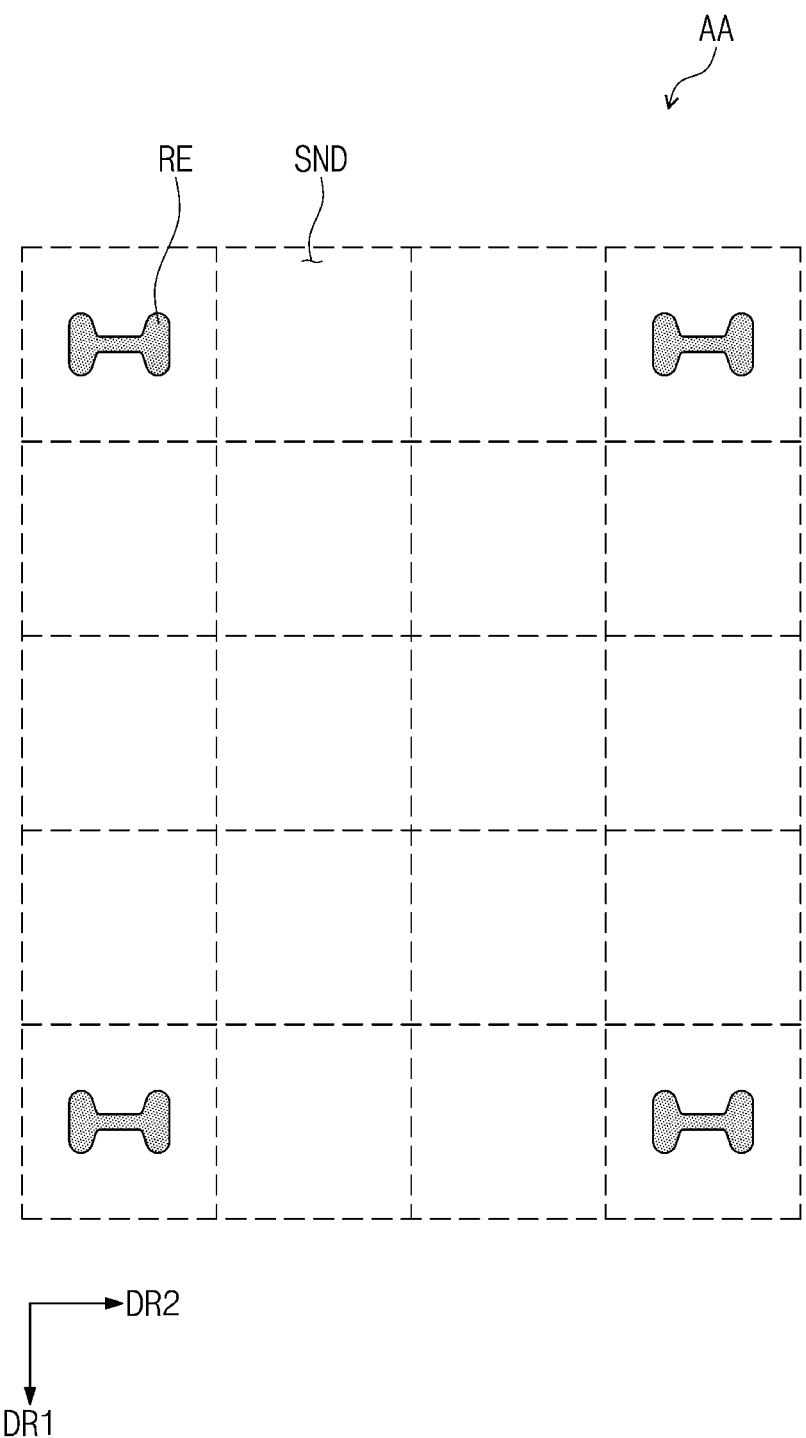

FIGS. 12A and 12B are schematic views illustrating an active area according to an embodiment of the present disclosure. FIGS. 12A and 12B schematically illustrate the active area AA in which a plurality of sensor units SND are defined. The configuration of each of the sensor units SND in FIGS. 12A and 12B may refer to FIG. 7.

The optical sensor LS (refer to FIG. 7) may be disposed in the entire active area AA. At least one optical sensor LS may be disposed in each of the plurality of sensor units SND. In FIG. 12A, the light receiving element RE may be disposed in the entire active area AA. At least one light receiving element RE may be disposed in each of the plurality of sensor units SND.

The optical sensor LS (refer to FIG. 7) may be disposed only in a portion of the active area AA. For example, the light receiving element RE may be disposed in a portion of the active area AA. In FIG. 12B, the light receiving element RE is illustrated as being disposed only in edge areas. However, the present disclosure is not necessarily limited thereto. A plurality of optical sensors LS may be disposed in each of sensor units SND in a portion of the active area AA. In this regard, FIG. 7 is referred to.

Figure 13:
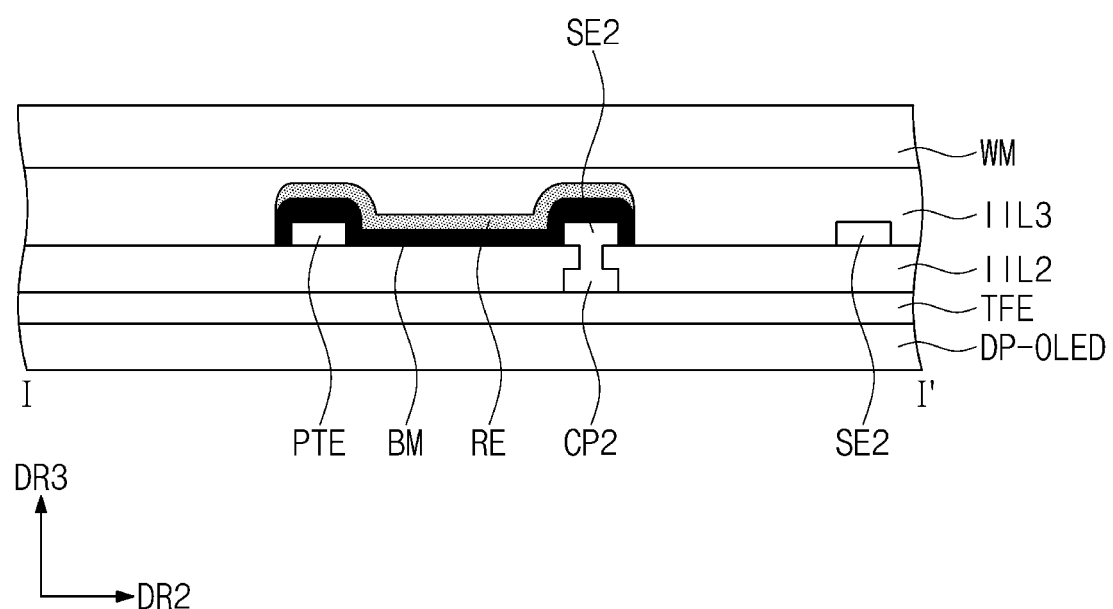
FIG. 13 is a cross-sectional view of an input sensor according to an embodiment of the present disclosure.

FIG. 13 is a cross-sectional view of an input sensor according to an embodiment of the present disclosure.

In FIG. 13, a light blocking pattern BM may be disposed under a light receiving element RE. The light blocking pattern BM may be disposed on a second insulating layer IIL2. The light blocking pattern BM may cover a photo-electrode PTE and a second sensing electrode SE2. For example, the light blocking pattern BM may be disposed on the second insulating layer IIL2 and may be disposed between the light receiving element RE, the photo-electrode PTE, and the second sensing electrode SE2. The light blocking pattern BM may overlap the light receiving element RE.

The light blocking pattern BM may be disposed between the display element layer DP-OLED and the light receiving element RE and may block light emitted from the display element layer DP-OLED. Accordingly, the light receiving element RE may sense only light incident from the outside, and thus the accuracy in sensing external light may be increased.

In FIG. 13, the second sensing electrode SE2 has a bi-layer structure. A second connecting part CP2 may be disposed on the conductive layer ICL1 (refer to FIG. 5) disposed on the encapsulation layer TFE and may be connected to a sensor part on the second insulating layer IIL2 through a contact hole. In FIG. 13, the photo-electrode PTE is disposed on the second insulating layer 1112. Any element not described in detail with respect to FIG. 13 may be understood to be at least similar to a corresponding element shown in FIG. 9 and described with reference thereto.

Figure 14A:
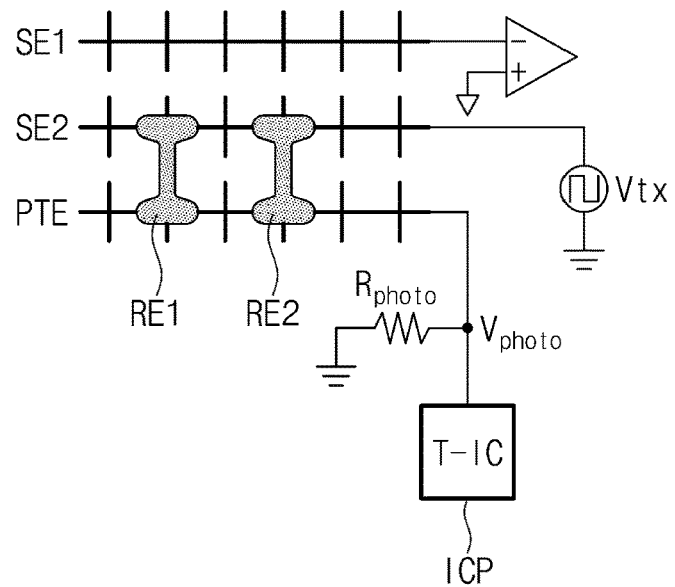
FIGS. 14A to 14C are schematic views illustrating optical-sensor driving methods according to embodiments of the present disclosure.
Figure 14B:
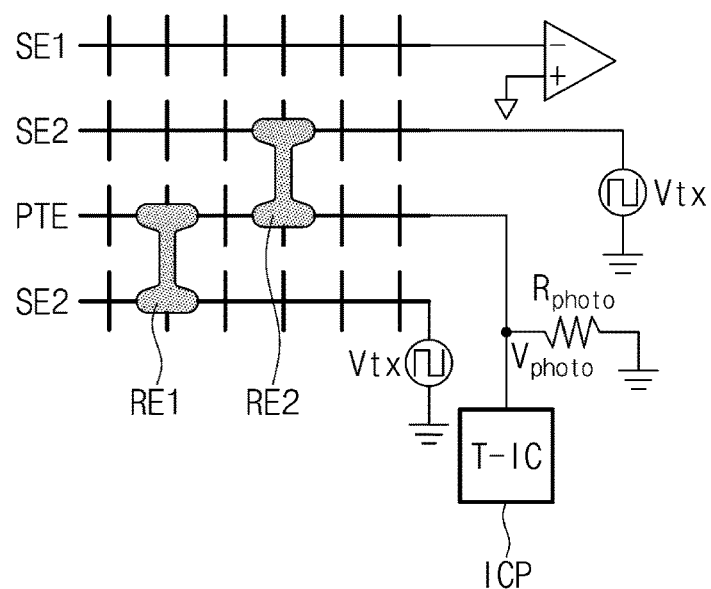
Figure 14C:
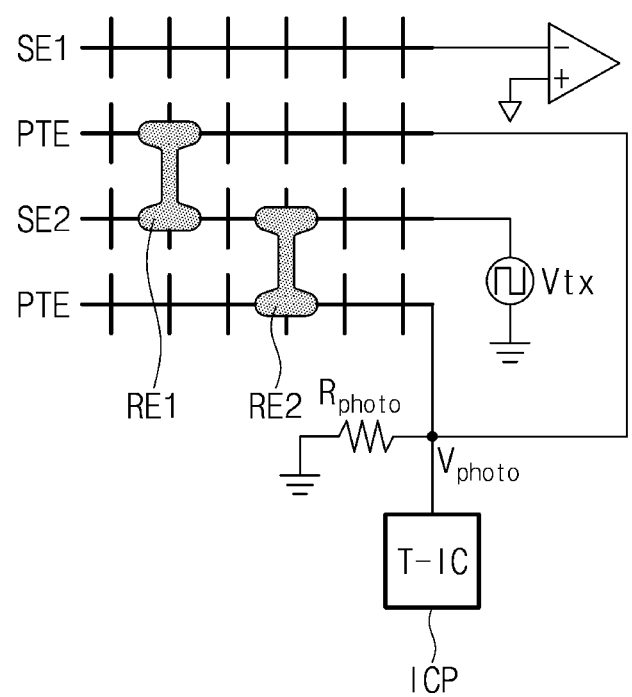
Figure 15:
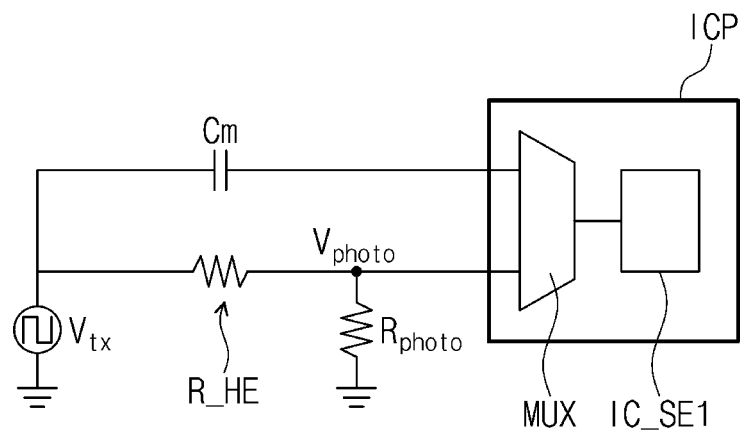
FIG. 15 is a schematic view illustrating an optical-sensor driving method according to an embodiment of the present disclosure.

FIGS. 14A to 14C are schematic views illustrating optical-sensor driving methods according to embodiments of the present disclosure. FIG. 15 is a schematic view illustrating an optical-sensor driving method according to an embodiment of the present disclosure.

FIGS. 14A to 14C are views illustrating embodiments different from the embodiment illustrated in FIG. 11. In FIG. 14A, first and second light receiving elements RE1 and RE2 may be disposed between a photo-electrode PTE and a second sensing electrode SE2. The first light receiving element RE1 and the second light receiving element RE2 may be spaced apart from each other. Although the two light receiving elements RE1 and RE2 are illustrated in FIG. 14A, two or more light receiving elements may be provided.

In FIG. 1413, a photo-electrode PTE may be disposed between a plurality of second sensing electrodes SE2. The photo-electrode PTE may be connected to the plurality of second sensing electrodes SE2 adjacent thereto. The photo-electrode PTE may be connected to two adjacent second sensing electrodes SE2 through a first light receiving element RE1 and a second light receiving element RE2. Although one first light receiving element RE1 is illustrated, a plurality of first light receiving elements RE1 may be provided. A plurality of second light receiving elements RE2 may be provided.

In FIG. 14C, a plurality of photo-electrodes PTE may be provided. The plurality of photo-electrodes PTE may be connected to one second sensing electrode SE2 adjacent thereto. One photo-electrode PTE adjacent to the one second sensing electrode SE2 may be connected to the one second sensing electrode SE2 through a first light receiving element RE1, and another photo-electrode PTE may be connected to the one second sensing electrode SE2 through a second light receiving element RE2. Although one first light receiving element RE1 and one second light receiving element RE2 are illustrated, a plurality of first light receiving elements RE1 and a plurality of second light receiving elements RE2 may be provided.

The plurality of photo-electrodes PTE may be connected to one sensing driver ICP. At least one photo-resistive element Rphoto may be disposed between the plurality of photo-electrodes PTE and the sensing driver ICP.

FIG. 15 illustrates a sensing driver according to an embodiment of the present disclosure. The sensing driver ICP may include a multiplexer MUX and a first sensing circuit IC_SE1. The first sensing circuit IC_SE1 may sense an external input sensed by the receiving electrode SE1 (refer to FIG. 7).

In an embodiment, the first sensing circuit IC_SE1 may be connected to the receiving electrode SE1 (refer to FIG. 7) and the photo-electrode PTE (refer to FIG. 7). For example, the first sensing circuit IC_SE1 may sense an external input and external light. In this embodiment, the photo-electrode PTE may be connected to the first sensing circuit IC_SE1 like the first sensing electrode SE1 without being connected to a separate light sensing circuit in the sensing driver ICP.

The multiplexer MUX may connect the first sensing electrode SE1 and the photo-electrode PTE to the first sensing circuit IC_SE1. The multiplexer MUX may selectively provide an external input through the first sensing electrode SE1 and a signal of external light through the photo-electrode PTE to the first sensing circuit IC_SE1. In this case, a second sensing circuit that is connected to the second sensing electrode SE2 (refer to FIG. 7) may perform a time-division operation to sense the external input and the external light in a time-division manner.

According to the embodiments of the present disclosure, the electronic device may include the optical sensor on the input sensor and thus may sense external light without a separate illuminance sensor module.

The electronic device may include the optical sensor over the display panel and thus might not be affected by the resolution of the display panel.

The electronic device may include the plurality of optical sensors and thus may have high accuracy in sensing external light.

The electronic device may be efficient in terms of space utilization and cost because the electronic device does not include a separate illuminance sensor module.

While the present disclosure has been described with reference to embodiments thereof, it will be apparent to those of ordinary skill in the art that various changes and modifications may be made thereto without departing from the spirit and scope of the present disclosure.

What is claimed is:

1. An electronic device, comprising:
a display panel;
an input sensor disposed on the display panel, the input sensor including a first sensing electrode and a second sensing electrode crossing the first sensing electrode; and
an optical sensor disposed on the input sensor,
wherein the optical sensor includes:
a photo-electrode disposed on the first sensing electrode or the second sensing electrode; and
a light receiving element electrically connecting the first sensing electrode or the second sensing electrode to the photo-electrode,
wherein the photo-electrode is distinct from the first sensing electrode and the second sensing electrode,
wherein the first sensing electrode extends in a first direction and includes a plurality of first sensor parts and a plurality of first connecting parts connecting the plurality of first sensor parts, and
wherein the second sensing electrode extends in a second direction crossing the first direction and includes a plurality of second sensor parts and a plurality of second connecting parts connecting the plurality of second sensor parts,
wherein at least one of the plurality of second sensor parts includes a first portion and a second portion spaced apart from each other, and
wherein the photo-electrode is disposed between the first portion and the second portion.

2. The electronic device of claim 1, wherein one of the first sensing electrode and the second sensing electrode is a transmitting electrode, and the other is a receiving electrode, and
wherein the photo-electrode is electrically connected to the transmitting electrode.

3. The electronic device of claim 1, wherein the light receiving element includes a photo-conductive element.

4. The electronic device of claim 3, wherein the photo-conductive element includes cadmium sulfide.

5. The electronic device of claim 1, wherein the photo-electrode is disposed on a same layer as the first sensing electrode and the second sensing electrode.

6. The electronic device of claim 1, wherein the first sensing electrode, the second sensing electrode, and the photo-electrode each have a mesh shape.

7. The electronic device of claim 1, further comprising:
an encapsulation layer disposed on the display panel,
wherein the input sensor is disposed directly on the encapsulation layer.

8. The electronic device of claim 1, wherein the input sensor further includes:
an insulating layer disposed on the display panel; and
a conductive layer disposed on the insulating layer,
wherein the first sensing electrode, the second sensing electrode, and the photo-electrode are each disposed within the conductive layer.

9. The electronic device of claim 8, wherein the light receiving element is disposed on the insulating layer and at least partially covers the photo-electrode and the first sensing electrode or the second sensing electrode.

10. The electronic device of claim 1, further comprising:
a sensing driver driving the input sensor and the optical sensor,
wherein the photo-electrode is connected to the sensing driver.

11. The electronic device of claim 10, wherein the optical sensor further includes a photo-resistive element connected between the photo-electrode and the sensing driver, and
wherein the sensing driver senses external light, based on a photo-voltage distributed between a first resistance of the light receiving element and a second resistance of the photo-resistive element.

12. The electronic device of claim 1, wherein there is an emissive area in which a pixel of the display panel is disposed and a non-emissive area that is adjacent to the emissive area, and
wherein the first sensing electrode, the second sensing electrode, the photo-electrode, and the light receiving element are disposed within the non-emissive area.

13. The electronic device of claim 1, wherein the plurality of first sensor parts, the plurality of second sensor parts, and the plurality of second connecting parts are disposed on a same layer, and the plurality of first connecting parts are disposed on a different layer from the plurality of first sensor parts, the plurality of second sensor parts, and the plurality of second connecting parts.

14. The electronic device of claim 1, wherein the light receiving element is provided in plural, and
wherein some of the plurality of light receiving elements connect the first portion to the photo-electrode, and the other light receiving elements connect the second portion to the photo-electrode.

15. The electronic device of claim 1, wherein the optical sensor further includes a light blocking pattern disposed between the photo-electrode and the light receiving element in a thickness direction of the photo-electrode, and
wherein the light blocking pattern at least partially overlaps the light receiving element.

16. The electronic device of claim 1, wherein a plurality of sensor units are defined in the input sensor, and
wherein the optical sensor is disposed in at least some of the plurality of sensor units.

17. The electronic device of claim 1, wherein each of the first sensing electrode, the second sensing electrode, and the photo-electrode is provided in plural,
wherein each of the photo-electrodes is disposed between first sensing electrodes adjacent to each other among the plurality of first sensing electrodes or between second sensing electrodes adjacent to each other among the plurality of second sensing electrodes, and
wherein the light receiving element includes a first light receiving element connected to one of the second sensing electrodes adjacent to each other and a second light receiving element connected to the other one of the second sensing electrodes adjacent to each other.

18. The electronic device of claim 10, wherein the sensing driver includes a multiplexer, and the sensing driver operates the input sensor and the optical sensor in a time-division manner through the multiplexer.

* * * * *